(12) United States Patent
Satoh et al.

(10) Patent No.: US 9,627,438 B1
(45) Date of Patent: Apr. 18, 2017

(54) THREE DIMENSIONAL MEMORY ARRAYS AND STITCHING THEREOF

(71) Applicant: Avalanche Technology, Inc., Fremont, CA (US)

(72) Inventors: Kimihiro Satoh, Fremont, CA (US); Bing K. Yen, Cupertino, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/141,726

(22) Filed: Apr. 28, 2016

(51) Int. Cl.
| | |
|---|---|
| *H01L 47/00* | (2006.01) |
| *H01L 27/22* | (2006.01) |
| *H01L 27/24* | (2006.01) |
| *H01L 45/00* | (2006.01) |

(52) U.S. Cl.
CPC .......... *H01L 27/222* (2013.01); *H01L 27/224* (2013.01); *H01L 27/2409* (2013.01); *H01L 27/2427* (2013.01); *H01L 27/2481* (2013.01); *H01L 45/06* (2013.01); *H01L 45/08* (2013.01); *H01L 45/1226* (2013.01); *H01L 45/141* (2013.01)

(58) Field of Classification Search
CPC ... H01L 27/222; H01L 27/224; H01L 27/228; H01L 27/2409; H01L 27/2481; G11C 11/15; G11C 11/161; G11C 11/5607

USPC .......................................................... 257/5
See application file for complete search history.

(56) References Cited

U.S. PATENT DOCUMENTS

| | | | |
|---|---|---|---|
| 8,441,837 B2 * | 5/2013 | Ikeda ................. | G11C 13/0007 365/148 |
| 2010/0219392 A1 * | 9/2010 | Awaya ................ | H01L 27/0688 257/3 |
| 2013/0044531 A1 * | 2/2013 | Baek ..................... | G11C 5/025 365/72 |
| 2014/0209892 A1 | 7/2014 | Kuo et al. | |
| 2015/0263067 A1 * | 9/2015 | Inaba .................... | H01L 27/228 257/295 |
| 2016/0020250 A1 | 1/2016 | Li et al. | |

* cited by examiner

*Primary Examiner* — Kevin M Picardat
(74) *Attorney, Agent, or Firm* — Bing K. Yen

(57) ABSTRACT

The present invention is directed to a memory device including a first layer of memory cells with each cell of the first layer of memory cells including a two-terminal selection element coupled to a memory element in series; a plurality of first local wiring lines connected to one ends of the first layer of memory cells along a first direction with each of the first local wiring lines being electrically connected to two first line selection transistors at two ends thereof; and a plurality of second local wiring lines connected to other ends of the first layer of memory cells along a second direction substantially orthogonal to the first direction with each of the second local wiring lines being electrically connected to two second line selection transistors at two ends thereof.

21 Claims, 11 Drawing Sheets

THREE DIMENSIONAL MEMORY ARRAYS AND STITCHING THEREOF

BACKGROUND

The present invention relates to a memory device, and more particularly, to exemplary embodiments of a three dimensional memory device having stitched arrays of memory cells.

A resistance-based memory device normally comprises an array of memory cells, each of which includes a memory element and a selection element coupled in series between two electrodes. The selection element functions like a switch to direct current or voltage through the selected memory element coupled thereto. The selection element may be a three terminal device, such as transistor, or a two-terminal device, such as diode or Ovanic threshold switch. Upon application of an appropriate voltage or current to the selected memory element, the electrical property of the memory element would change accordingly, thereby switching the stored logic in the respective memory cell.

FIG. 1 is a schematic circuit diagram of a memory array 30, which comprises a plurality of memory cells 32 with each of the memory cells 32 including a two-terminal selection element 34 coupled to a resistance-based memory element 36 in series; a first plurality of parallel wiring lines 38 with each being coupled to a respective row of the memory elements 36 in a first direction; and a second plurality of parallel wiring lines 40 with each being coupled to a respective row of the selection elements 34 in a second direction substantially perpendicular to the first direction. Accordingly, the memory cells 32 are located at the cross points between the first and second plurality of wiring lines 38 and 40.

The resistance-based memory element 36 may be classified into at least one of several known groups based on its resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths upon application of an appropriate voltage. The memory element of Magnetic Random Access Memory (MRAM) typically comprises at least two layers of ferromagnetic materials with an insulating tunnel junction layer interposed therebetween. When a switching current is applied to the memory element of an MRAM device, one of the ferromagnetic layers will switch its magnetization direction with respect to that of the other magnetic layer, thereby changing the electrical resistance of the element.

A magnetic memory element normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

The size of the memory array 30 illustrated FIG. 1 is often limited by the voltage drop caused by the parasitic resistance of the wiring lines 38 and 40, which may result in insufficient voltage or current to switch the selection element 34 or the memory element 36 or both. The convention approach to overcome the voltage drop issue is to increase the thickness of the wiring lines 38 and 40 in the vertical direction, thereby reducing the line resistance. However, as the width of the wiring lines 38 and 40 shrinks with progressive miniaturization of the memory cells 32, the thickness/width aspect ratio of the wiring lines 38 and 40 may become too high for the lines 38 and 40 to be reliably manufactured.

For the foregoing reason, there is a need for a memory device that has low voltage drop associated with its wiring lines and that can be inexpensively manufactured.

SUMMARY

The present invention is directed to a memory device that satisfies this need. A memory device having features of the present invention comprises a first layer of memory cells with each cell of the first layer of memory cells including a two-terminal selection element coupled to a memory element in series; a plurality of first local wiring lines connected to one ends of the first layer of memory cells along a first direction with each of the first local wiring lines being electrically connected to two first line selection transistors at two ends thereof; and a plurality of second local wiring lines connected to other ends of the first layer of memory cells along a second direction substantially orthogonal to the first direction with each of the second local wiring lines being electrically connected to two second line selection transistors at two ends thereof. The memory device may further comprise a plurality of first wiring lines extending along the first direction and a plurality of second wiring lines extending along the second direction. The two first line selection transistors at two ends of each of the first local wiring lines are further connected to one of the first wiring lines. The two second line selection transistors at two ends of each of the second local wiring lines are further connected to one of the second wiring lines.

According to another aspect of the present invention, a memory device comprises a first layer of memory cells; a plurality of first local wiring lines connected to one ends of the first layer of memory cells along a first direction with each of the first local wiring lines being electrically connected to two first line selection transistors at two ends thereof; a plurality of second local wiring lines connected to other ends of the first layer of memory cells along a second direction substantially orthogonal to the first direction with each of the second local wiring lines being electrically connected to two second line selection transistors at two ends thereof; a second layer of memory cells with one ends thereof coupled to the second local wiring lines; and a plurality of third local wiring lines connected to other ends of the second layer of memory cells along the first direction with each of the third local wiring lines being electrically connected to two third line selection transistors at two ends thereof. Each cell of the first and second layers of memory cells includes a two-terminal selection element coupled to a memory element in series. The memory device may further comprise a plurality of first wiring lines extending along the first direction and a plurality of second wiring lines extending along the second direction. The two first line selection transistors at two ends of each of the first local wiring lines are further connected to one of the first wiring lines. The two second line selection transistors at two ends of each of the second local wiring lines are further connected to one of the second wiring lines. The two third line selection transistors at two ends of each of the third local wiring lines are further connected to one of the first wiring lines.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 mm and whose upper limit is 100 nm.

Figure 1:
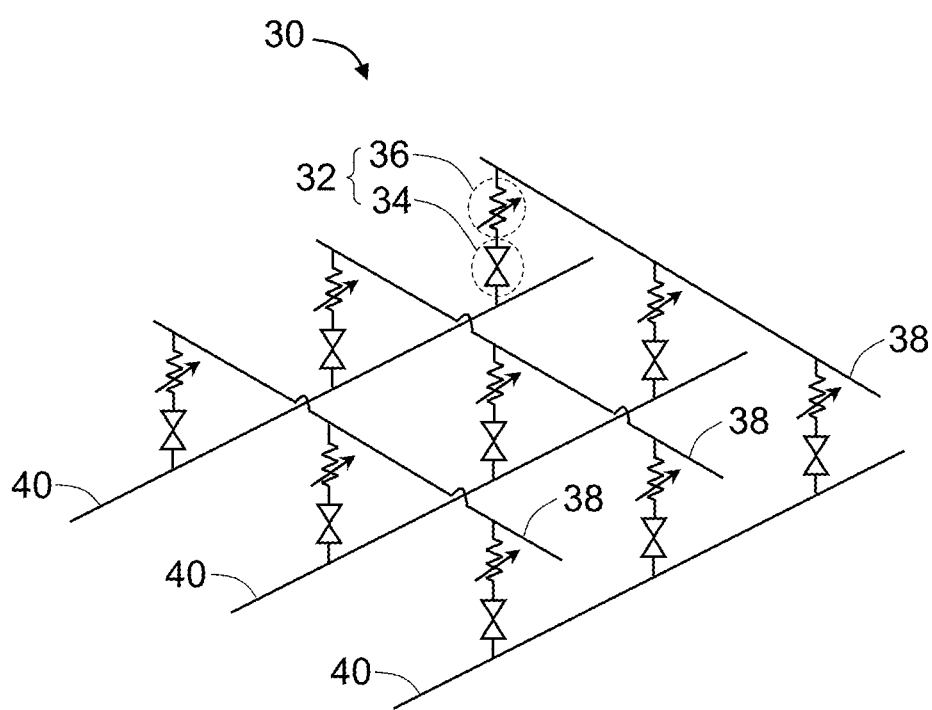
FIG. 1 is a schematic circuit diagram of a memory array including a plurality of memory cells with each comprising a memory element and a two-terminal selection element coupled in series.
Figure 2A:
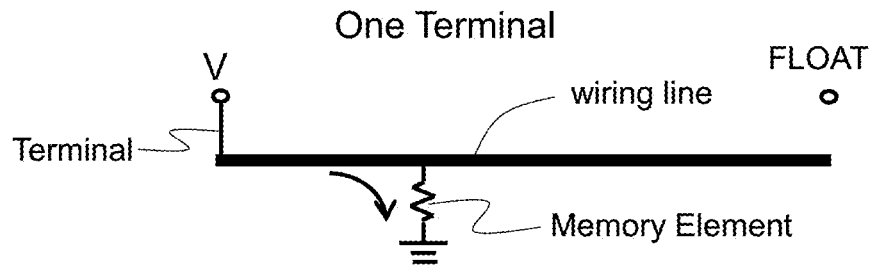
FIGS. 2A-2C show the IR drop for a conventional wiring line having one terminal connected to a voltage source and a wiring line having two terminals connected to a voltage source.

FIG. 2A shows the conventional approach of supplying a voltage to a memory element through a wiring line, one end of which is coupled to a terminal at a supplied voltage, V, while the other end is left floating. A memory element coupled to the wiring line would therefore experience a voltage (IR) drop that is essentially a linear function of the relative position of the memory element with respect to the terminal as illustrated by the plot shown in FIG. 2C. In other words, a memory element disposed a distance 2d away from the terminal would experience twice the voltage drop compared with another memory element disposed a distance d away, ceteris paribus, owing to the parasitic resistance of the wiring line.

Figure 2B:
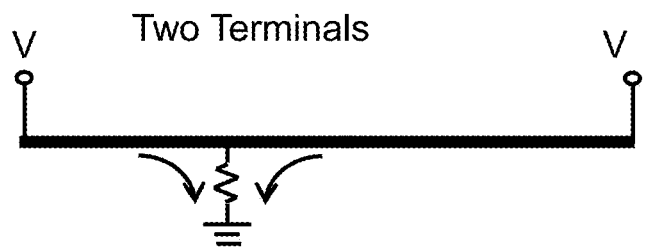
Figure 2C:
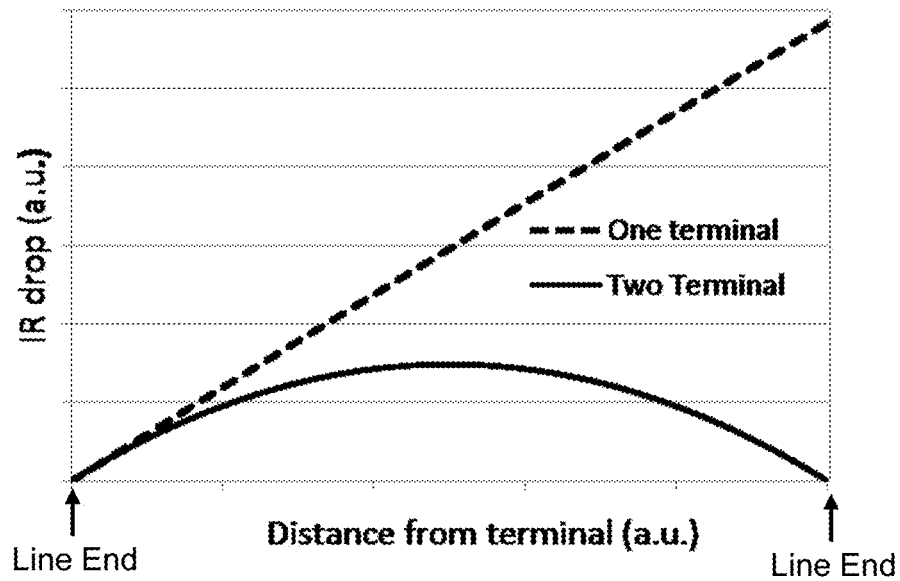

FIG. 2B shows an embodiment of the present invention as applied to a memory architecture that reduces the voltage drop experienced by the memory elements. In contrast to the conventional approach of supplying a voltage to a memory element through only one end of the wiring line, the present invention supplies a voltage to a memory element through both ends of the wiring line, thereby markedly reducing the voltage drop as illustrated by the plot in FIG. 2C. Compared with the maximum voltage drop for the conventional single terminal approach, which occurs at the end of the wiring line opposite the terminal, the maximum voltage drop for the two terminal approach, which occurs at the center of the wiring line, is three-fourths less. Accordingly, in situations where the voltage drop must be limited to a critical value, the two terminal approach would allow the wiring line to be four times as long, resulting in the memory array being 16 times as large as that of the conventional approach.

Figure 3:
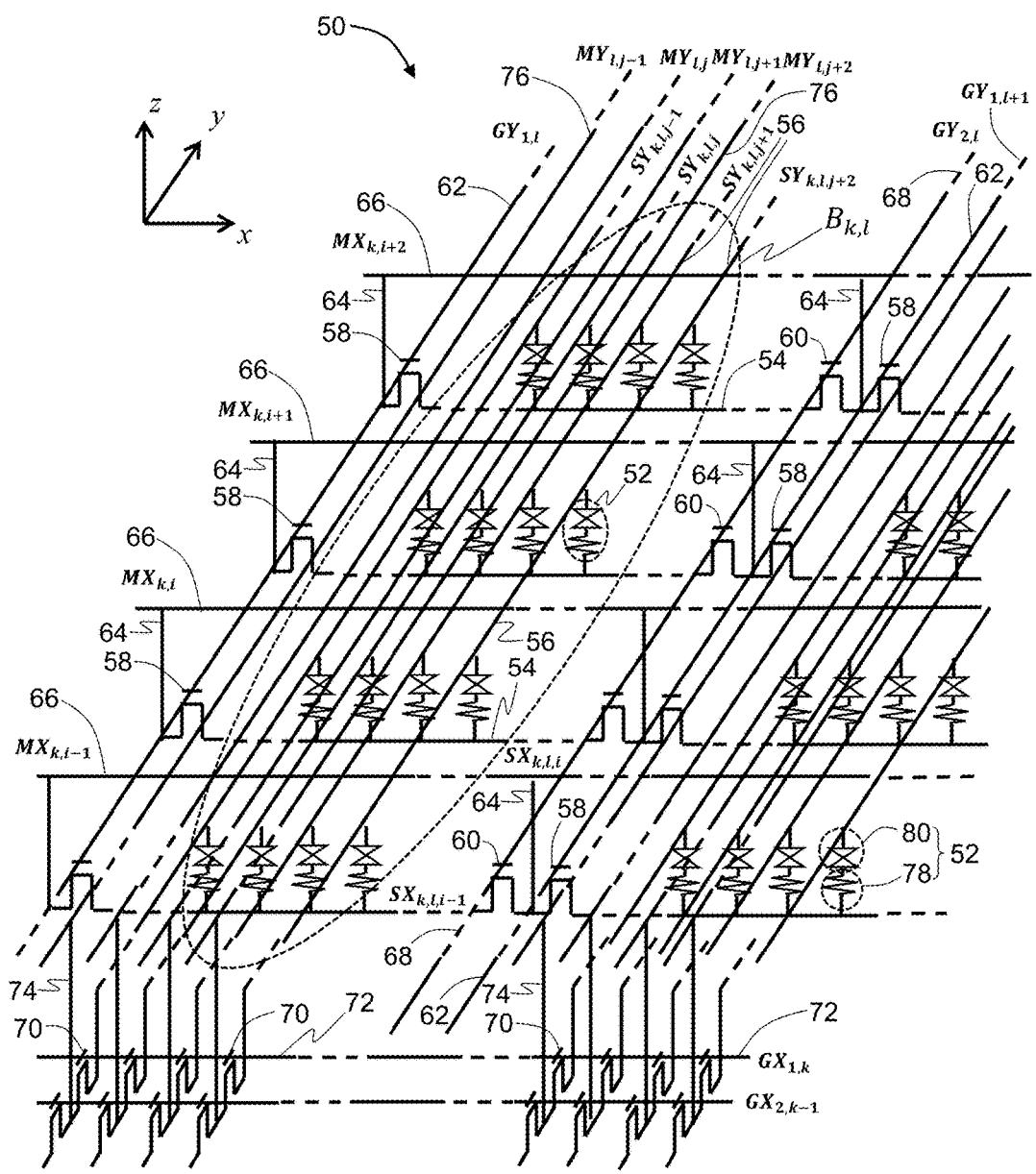
FIG. 3 is a schematic circuit diagram of a memory device in accordance with an embodiment of the present invention.

FIG. 3 shows an exemplary embodiment of the present invention as applied to a memory device in which the voltage to a memory cell is applied from both ends of each wiring line coupled thereto. Referring now to FIG. 3, the exemplary memory device 50 includes a plurality of memory cells 52, a plurality of first local wiring lines 54 coupled to the bottoms of the memory cells 52 along the x-direction, and a plurality of second local wiring lines 56 coupled to the tops of the memory cells 52 along the y-direction, which is substantially perpendicular to the x-direction. One end of each of the first local wiring lines 54 is coupled to a source or drain of one of a plurality of first line select transistors 58, while the other end is coupled to a source or drain of one of a plurality of second line select transistors 60. Each of the first line select transistors 58 has a gate connected to one of a plurality of first gate lines 62, a terminal (source or drain) coupled to a respective one of the first local wiring lines 54, and another terminal (source or drain) coupled to a respective one of a plurality of first contacts 64, which in turn is coupled to a respective one of a plurality of first wiring lines 66 extending along the x-direction. Each of the first gate lines 62 couples to gates of a respective row of first line select transistors 58 along the y-direction.

Similarly, each of the second line select transistors 60 has a gate connected to one of a plurality of second gate lines 68, a terminal (source or drain) coupled to a respective one of the first local wiring lines 54, and another terminal (source or drain) coupled to a respective one of the first contacts 64, which in turn is coupled to a respective one of the first wiring lines 66 extending along the x-direction. Each of the second gate lines 68 couples to gates of a respective row of second line select transistors 60 along the y-direction.

With continuing reference to FIG. 3, a first end of each of the second local wiring lines 56 is electrically connected to a source or drain of one of a plurality of third line select transistors 70. Each of the third line select transistors 70 has a gate connected to one of a plurality of third gate lines 72, a terminal (source or drain) coupled to a respective one of the second local wiring lines 56, and another terminal (source or drain) coupled to a respective one of a plurality of second contacts 74, which in turn is coupled to a respective one of a plurality of second wiring lines 76 extending along the y-direction. Each of the third gate lines 72 couples to gates of a respective row of the third line select transistors 70 along the x-direction.

While not explicitly shown in FIG. 3 for reasons of clarity, a second end, which is opposite to the first end, of each of the second local wiring lines 56 is electrically connected to a source or drain of one of a plurality of fourth line select transistors (not shown), analogous to the structures at the first end. Each of the fourth line select transistors has a gate connected to one of a plurality of fourth gate lines (not shown), a terminal (source or drain) coupled to a respective one of the second local wiring lines 56, and another terminal (source or drain) coupled to a respective one of a plurality of second contacts (not shown), which in turn is coupled to a respective one of the plurality of second wiring lines 76 extending along the y-direction. Each of the fourth gate lines couples to gates of a respective row of fourth line select transistors along the x-direction. The fourth line select transistors, the fourth gate lines, the second contacts, and their counterparts 70-74 at the first end have a reflection symmetry with respect to the center of the second local wiring lines 56. The arrangement of the second local wiring lines 56 and the components connected thereto is analogous to the arrangement of the first local wiring lines 54 and the components connected thereto with a 90° rotation about the z-axis, which is substantially orthogonal to the x and y-directions.

The memory cells 52 may be arranged in a square or rectangular array and are disposed at the cross points between the first and second local wiring lines 54 and 56. Each of the memory cells 52 includes a respective one of a plurality of memory elements 78 and a respective one of a plurality of two-terminal selection elements 80 coupled in series. While FIG. 3 shows the two-terminal selection elements 80 being formed above the memory elements 78, the stacking order of the selection elements 80 and the memory elements 78 may be reversed without affecting the performance of the memory cells 52. Moreover, the first and second wiring lines 66 and 76 are shown disposed above the first and second local wiring lines 54 and 56, but the stacking order may be reversed as will be illustrated and described later.

The memory elements 78 may switch their resistance state by any suitable switching mechanism, such as but not limited to phase change, precipitate bridging, magnetoresistive switching, or any combination thereof. In one embodiment, each of the memory elements 78 comprises a phase change chalcogenide compound, such as but not limited to $Ge_2Sb_2Te_5$ or AgInSbTe, which can switch between a resistive phase and a conductive phase. In another embodiment, each of the memory elements 78 comprises a nominally insulating metal oxide material, such as but not limited to NiO, $TiO_2$, or $Sr(Zr)TiO_3$, which can switch to a lower electrical resistance state as metal rich precipitates grow and link to form conductive paths upon application of an appropriate voltage. In still another embodiment, each of the memory elements 78 comprises two layers of ferromagnetic materials with an insulating electron tunnel junction layer interposed therebetween, collectively forming a magnetic tunnel junction (MTJ). When a switching pulse is applied, one of the ferromagnetic layers would switch the magnetization direction thereof, thereby changing the electrical resistance of the MTJ.

The two-terminal selection elements 80 allow current to flow both ways upon application of a sufficiently high voltage thereto. The selection elements 80 may be made of any suitable two-terminal switching device, such as but not limited to Schottky diode, Ovanic threshold switch, mixed-ionic-electronic-conduction (MIEC) based switching device, or any combination thereof. In cases where the memory elements 78 may be switched between low and high resistance states using unipolar voltage or current, conventional diodes may also be utilized for the two-terminal selection elements 80.

One or more of the first and second local wiring lines 54, 56 and the first and second wiring lines 66, 76 may be made of any suitable conductor, such as but not limited to copper (Cu), tungsten (W), aluminum (Al), silver (Ag), tantalum (Ta), titanium nitride (TiN), tantalum nitride (TaN), or any combination thereof. The first and second contacts 64 and 74 each may comprise any suitable conductive material, such as tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), titanium (Ti), palladium (Pd), platinum silicide (PtSi), Indium (In), or combinations thereof.

An array or block of memory cells 52 denoted by the reference symbol $B_{k,l}$ in FIG. 3 is bounded in the x-direction by one of the first gate lines 62 and one of the second gate lines 68, which are denoted by the reference symbols $GY_{1,l}$ and $GY_{2,l}$, respectively. The same memory block $B_{k,l}$ is bounded in the y-direction by one of the third gate lines 72 denoted by $GX_{1,k}$ and one of the fourth gate lines denoted by $GX_{2,k}$, which will be shown in one or more subsequent figures. The subscripts k and l represent the $k^{th}$ and $l^{th}$ segments of the memory device 50 in the y and x-directions, respectively. Therefore, the memory block $B_{k,l}$ is located in the $k^{th}$ segment in the y-direction and the $l^{th}$ segment in the x-direction. Within the memory block $B_{k,l}$, the plurality of first local wiring lines 54 represented by $SX_{k,l,i-1}$, $SX_{k,l,i}$, $SX_{k,l,i+1}$, $SX_{k,l,i+2}$, and so forth and the plurality of first wiring lines 66 represented by $MX_{k,i-1}$, $MX_{k,i}$, $MX_{k,i+1}$, $MX_{k,i+2}$, and so forth extend along the x-direction. Similarly, the plurality of second local wiring lines 56 represented by $SY_{k,l,j-1}$, $SY_{k,l,j}$, $SY_{k,l,j+1}$, $SY_{k,l,j+2}$, and so forth and the plurality of second wiring lines 76 represented by $MY_{l,j-1}$, $MY_{l,j}$, $MY_{l,j+1}$, $MY_{l,j+2}$, and so forth extend along the y-direction. The subscripts i and j represent the $i^{th}$ and $j^{th}$ positions within a memory block in the y and x-directions, respectively. Therefore, any one of the memory cells 52 in the memory device 50 may be uniquely distinguished by the four subscript identifiers k, l, i, and j with the former two identifying the memory block and the latter two identifying the location within the memory block.

In an embodiment, the memory cells 52 in the memory block $B_{k,l}$ are arranged in a square array with the center-to-center distance between two adjacent memory cells 52 being 2F in the x and y-directions, where F denotes the minimum feature size or one half the minimum feature pitch normally associated with a particular manufacturing process. Accordingly, each of the memory cells 52 may have a cell size of $4F^2$ in the x-y plane, or a plane parallel to the substrate. The first local wiring lines 54, which extend along the x-direction, may be spaced apart with a pitch of 2F in the y-direction. Similarly, the second local wiring lines 56 may be spaced apart with a pitch of 2F in the x-direction. Likewise, the first and second wiring lines 66 and 76, which form above the local wiring lines 54 and 56, may each have a pitch of 2F.

Figure 4:
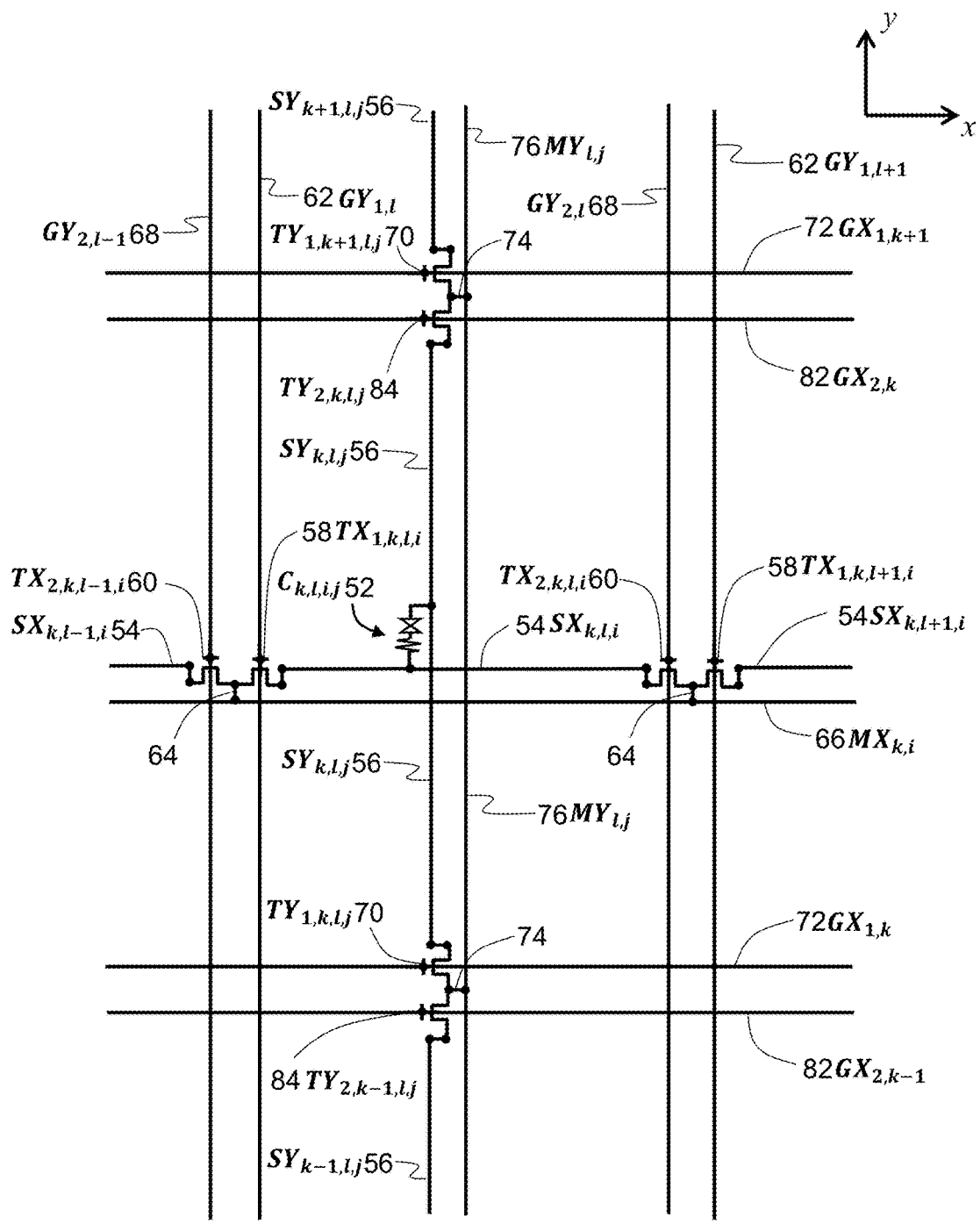
FIG. 4 is another schematic circuit diagram of the memory device of FIG. 3.

Operation of the memory device 50 will now be described with reference to a circuit diagram thereof illustrated in FIG. 4. In the drawing, reference numerals 54 to 76 denote the same or similar components as those shown for the memory device 50 in FIG. 3. The circuit diagram of FIG. 4 is different from the circuit diagram of FIG. 3 in that only one memory cell denoted by $C_{k,l,i,j}$ and components electrically connected thereto are shown for reasons of clarity. The memory cell $C_{k,l,i,j}$, which is located at the $i^{th}$ and $j^{th}$ positions in the y and x-directions, respectively, within the memory block $B_{k,l}$ that is located in the $k^{th}$ and $l^{th}$ segments of the memory device 50 in the y and x-directions, respectively, may be chosen for a read or write operation by selecting one of the first wiring lines 66 denoted by $MX_{k,i}$, one of the second wiring lines 76 denoted by $MY_{l,j}$, one of the first gate lines 62 denoted by $GY_{1,l}$, one of the second gate lines 68 denoted by $GY_{2,l}$, one of the third gate lines 72 denoted by $GX_{1,k}$, and one of the fourth gate lines 82 denoted by $GX_{2,k}$. The first and second wiring lines 66 and 76 may respectively operate as word lines and bit lines, or as bit lines and word lines. An voltage $V_x$ may be applied to the first wiring line $MX_{k,i}$ and/or another voltage $V_y$ may be applied to the second wiring line $MY_{l,j}$. After the relevant gate lines are selected, the voltage $V_x$ from the first wiring line $MX_{k,i}$ may be transmitted to one of the first local wiring lines 54 denoted by $SX_{k,l,i}$ through both ends thereof via two of the first contacts 64, one of the first line select transistors 58 denoted by $TX_{1,k,l,i}$, and one of the second line select transistors 60 denoted by $TX_{2,k,l,i}$. Similarly, the voltage $V_y$ from the second wiring line $MY_{l,j}$ may be transmitted to one of the second local wiring lines 56 denoted by $SY_{k,l,j}$ through both ends thereof via two of the second contacts 74, one of the third line select transistors 70 denoted by $TY_{1,k,l,j}$, and one of the fourth line select transistors 84 denoted by $TY_{2,k,l,j}$. As the voltage difference between the first and second local wiring lines $SX_{k,l,i}$ and $SY_{k,l,j}$ across the memory cell $C_{k,l,i,j}$ exceeds a threshold, the selection element of the memory cell $C_{k,l,i,j}$ becomes conductive, thereby selecting the memory element of the memory cell $C_{k,l,i,j}$ for read or write operation.

With continuing reference to FIG. 4, one end of each of the first contacts 64 is coupled to one of the first wiring lines 66, while the other end is simultaneously coupled to a terminal (source or drain) of one of the first line select transistors 58 and a terminal (source or drain) of one of the second line select transistors 60 from adjacent memory blocks in the x-direction. For example, one terminal of the first line select transistor $TX_{1,k,l,i}$ in the memory block $B_{k,l}$ and one terminal of the second line select transistor $TX_{2,k,l-1,i}$ in the memory block $B_{k,l-1}$ are coupled to one end of one of the first contacts 64, the other end of which is coupled to the first wiring line $MX_{k,i}$. Likewise, one end of each of the second contacts 74 is coupled to one of the second wiring lines 76, while the other end is simultaneously coupled to a terminal (source or drain) of one of the third line select transistors 70 and a terminal (source or drain) of one of the fourth line select transistors 84 from adjacent memory blocks in the y-direction. Accordingly, the first and second contacts 64 and 74 are disposed at the boundary regions between memory blocks.

Figure 5:
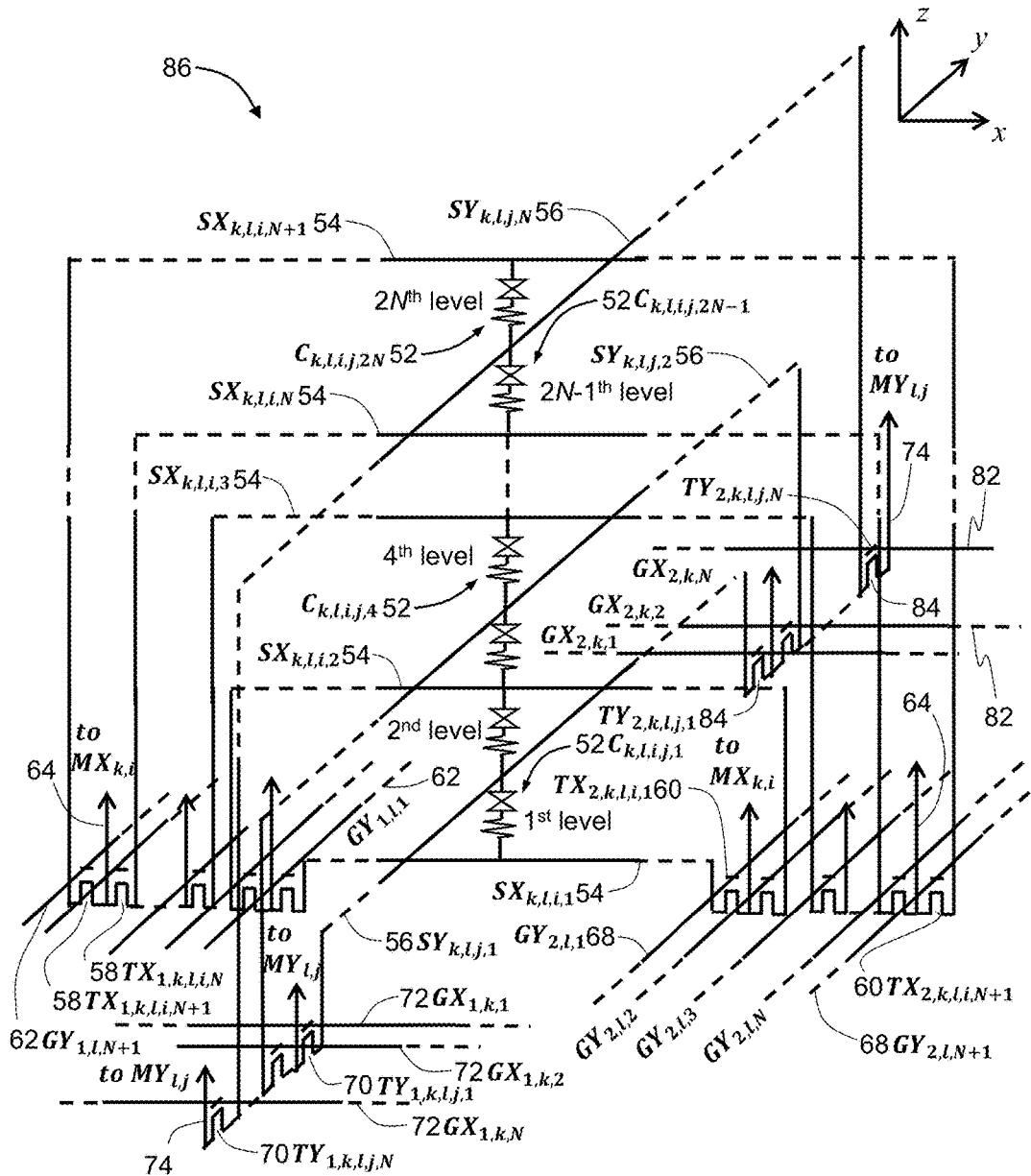
FIG. 5 is a schematic circuit diagram of a memory device having multiple memory layers in accordance with another embodiment of the present invention.

FIG. 5 shows another exemplary embodiment of the present invention as applied to a multi-layered memory device in which the voltage to a memory cell is applied from both ends of each wiring line coupled thereto. In the drawing, reference numerals 52-64, 68-74, and 78-84 denote the same or similar components as those shown for the memory device 50 in FIGS. 3 and 4. Referring now to FIG. 5, the exemplary memory device 86 includes 2N layers of memory cells in each of a plurality of memory blocks, where N is an integer greater than or equal to 1. Each layer of memory cells is substantially similar to the memory cells 52 of the exemplary memory device 50 illustrated in FIG. 3. However, for reasons of brevity and clarity, the first and second wiring lines 66 and 76 are omitted and only one memory cell $C_{k,l,i,j,m}$ which is located at the $m^{th}$ level and at the $i^{th}$ and $j^{th}$ positions in the y and x-directions, respectively, within the memory block $B_{k,l}$ that is located in the $k^{th}$ and $l^{th}$ segments of the memory device 86 in the y and x-directions, respectively, and components electrically connected to the memory cell are shown for each layer.

With continuing reference to FIG. 5, each of the memory elements 52 at each level is coupled between one of the first local wiring lines 54 and one of the second local wiring lines 56. One end of each of the first local wiring lines 54 is coupled to a source or drain of one of the first line select transistors 58, while the other end is coupled to a source or drain of one of the second line select transistors 60. Each of the first line select transistors 58 has a gate connected to one of the first gate lines 62, a terminal (source or drain) electrically connected to a respective one of the first local wiring lines 54, and another terminal (source or drain) coupled to a respective one of the first contacts 64, which in turn is coupled to a respective one of the first wiring lines (not shown) extending along the x-direction. Similarly, each of the second line select transistors 60 has a gate connected to one of the second gate lines 68, a terminal (source or drain) electrically connected to a respective one of the first local wiring lines 54, and another terminal (source or drain) coupled to a respective one of the first contacts 64, which in turn is coupled to a respective one of the first wiring lines (not shown) extending along the x-direction.

Likewise, one end of each of the second local wiring lines 56 is coupled to a source or drain of one of the third line select transistors 70, while the other end is coupled to a source or drain of one of the fourth line select transistors 84. Each of the third line select transistors 70 has a gate connected to one of the third gate lines 72, a terminal (source or drain) electrically connected to a respective one of the second local wiring lines 56, and another terminal (source or drain) coupled to a respective one of the second contacts 74, which in turn is coupled to a respective one of the second wiring lines (not shown) extending along the y-direction. Similarly, each of the fourth line select transistors 84 has a gate connected to one of the fourth gate lines 82, a terminal (source or drain) electrically connected to a respective one of the second local wiring lines 56, and another terminal (source or drain) coupled to a respective one of the second contacts 74, which in turn is coupled to a respective one of the second wiring lines (not shown) extending along the y-direction.

The memory device 86 of FIG. 5 with 2N layers of the memory cells 52 includes N+1 levels of the first local wiring lines 54 interleaved with N levels of the second local wiring lines 56. Each layer of the memory cells 52 is disposed between a respective level of the first local wiring lines 54 and a respective level of the second local wiring lines 56. Accordingly, each level of the first and second local wiring lines 54 and 56, except for the very top and bottom levels, is coupled to two layers of the memory cells 52 adjacent thereto. For example, one of the second local wiring lines 56 denoted by $SY_{k,l,j,N}$, which is disposed between the $2N-1^{th}$ and $2N^{th}$ layers of memory cells, is coupled to the memory cell $C_{k,l,i,j,2N-1}$ therebeneath and the memory cell $C_{k,l,i,j,2N}$ thereabove. It should be noted that while the memory device 86 is shown to have an even number of memory layers (i.e. 2N) in FIG. 5, the present invention can be practiced with an odd number of memory layers as well.

Operation of the memory device 86 will now be described with reference to FIG. 5. A memory cell $C_{k,l,i,j,2N}$, which is located at the $2N^{th}$ level and at the $i^{th}$ and $j^{th}$ positions along the y and x-directions, respectively, within the memory block $B_{k,l}$ that is located in the $k^{th}$ and $l^{th}$ segments of the memory device 86 in the y and x-directions, respectively, may be chosen for a read or write operation by selecting one of the first wiring lines denoted by $MX_{k,i}$ (not shown), one of the second wiring lines denoted by $MY_{l,j}$ (not shown), one of the first gate lines 62 denoted by $GY_{1,l,N+1}$, one of the second gate lines 68 denoted by $GY_{2,l,N+1}$, one of the third gate lines 72 denoted by $GX_{1,k,N}$, and one of the fourth gate lines 82 denoted by $GX_{2,k,N}$. An voltage $V_x$ may be applied to the first wiring line $MX_{k,i}$ and/or another voltage $V_y$ may be applied to the second wiring line $MY_{l,j}$. After the relevant gate lines are selected, the voltage $V_x$ from the first wiring line $MX_{k,i}$ may be transmitted to one of the first local wiring lines 54 denoted by $SX_{k,l,i,N+1}$ through both ends thereof via two of the first contacts 64, one of the first line select transistors 58 denoted by $TX_{1,k,l,i,N+1}$, and one of the second line select transistors 60 denoted by $TX_{2,k,l,i,N+1}$. Similarly, the voltage $V_y$ from the second wiring line $MY_{l,j}$ may be transmitted to one of the second local wiring lines 56 denoted by $SY_{k,l,j,N}$ through both ends thereof via two of the second contacts 74, one of the third line select transistors 70 denoted by $TY_{1,k,l,j,N}$, and one of the fourth line select transistors 84 denoted by $TY_{2,k,l,j,N}$. As the voltage difference between the first and second local wiring lines $SX_{k,l,i,N+1}$ and $SY_{k,l,j,N}$ across the memory cell $C_{k,l,i,j,2N}$ exceeds a threshold, the selection element of the memory cell $C_{k,l,i,j,2N}$ becomes sufficiently conductive, thereby selecting the memory element of the memory cell $C_{k,l,i,j,2N}$ for read or write operation.

Figure 6:
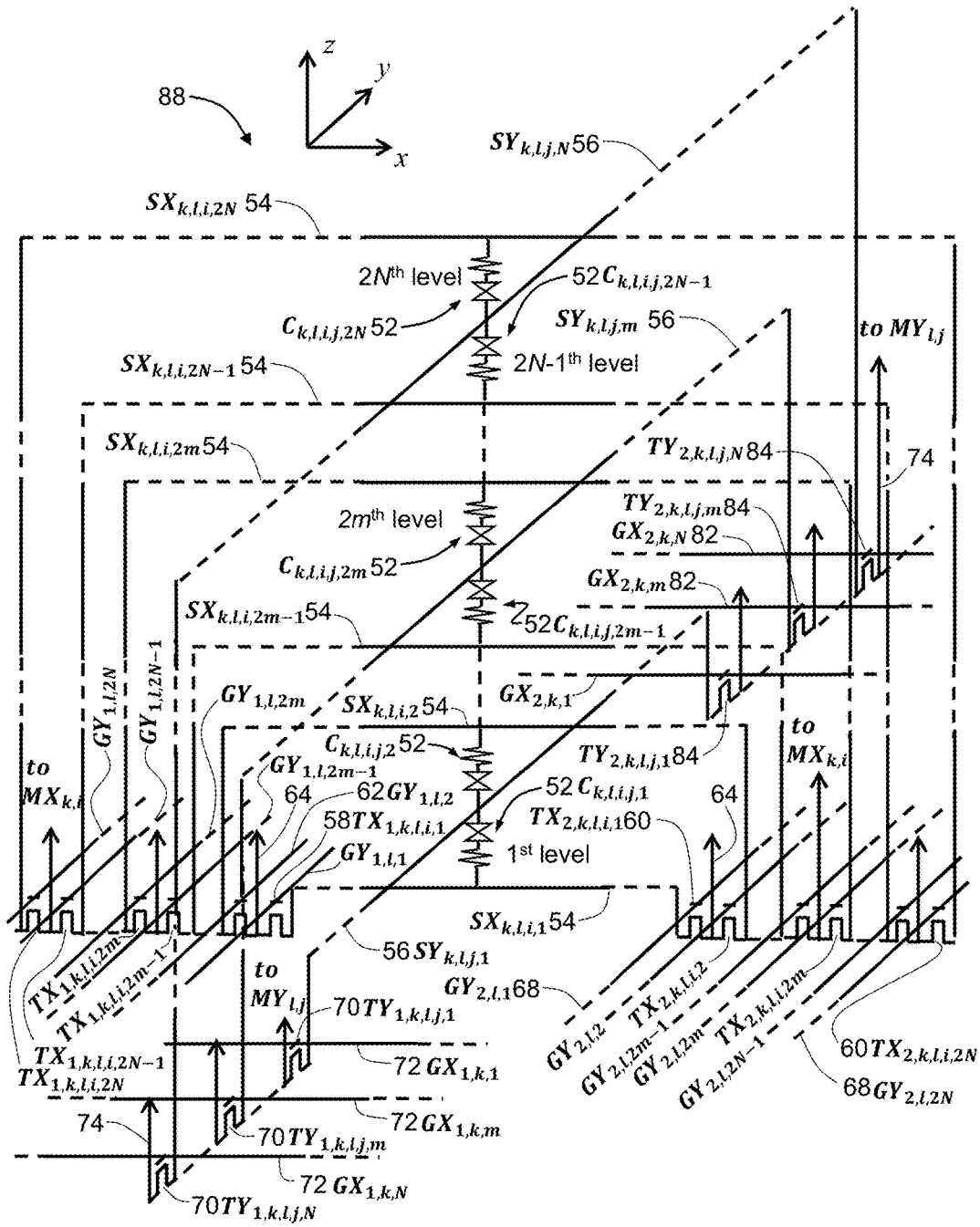
FIG. 6 is a schematic circuit diagram of a memory device having multiple memory layers in accordance with still another embodiment of the present invention.

FIG. 6 shows still another exemplary embodiment of the present invention as applied to a multi-layered memory device in which the voltage to a memory cell is applied from both ends of each wiring line coupled thereto. In the drawing, reference numerals 52-64, 68-74, and 78-84 denote the same or similar components as those shown for the memory devices 50 and 86 in FIGS. 3-5. Referring now to FIG. 6, the exemplary memory device 88 includes 2N layers of memory cells in each of a plurality of memory blocks, where N is an integer greater than or equal to 1. Each layer of memory cells is substantially similar to the memory cells 52 of the exemplary memory device 50 illustrated in FIG. 3. However, for reasons of brevity and clarity, the first and second wiring lines 66 and 76 are omitted and only one memory cell $C_{k,l,i,j,2m}$, which is located at the $2m^{th}$ level and at the $i^{th}$ and $j^{th}$ positions along the y and x-directions, respectively, within the memory block $B_{k,l}$ that is located in the $k^{th}$ and $l^{th}$ segments of the memory device 90 along the y and x-directions, respectively, and components electrically connected to the memory cell are shown for each layer.

The embodiment of FIG. 6 differs from the memory device 86 of FIG. 5 in that only the first local wiring lines 54 or the second local wiring lines 56, not both, are shared between two layers of memory cells 52 adjacent thereto. The memory device 88 includes N stacks of bi-level memory layers with each bi-level memory layers comprising one layer of the second local wiring lines 56 formed between two layers of the memory cells 52, which are disposed between two layers of the first local wiring lines 54. Alternatively, the first local wiring lines 54, instead of the second local wiring lines 56 as shown in FIG. 6, may be coupled to two layers of the memory cells 52 adjacent thereto. While FIG. 6 shows the memory cells 52 being oriented in such a way that the selection elements 80 are disposed adjacent to the second local wiring lines 56, the orientation of the memory cells 52 may be reversed such that the selection elements 80 are disposed adjacent to the first local wiring lines 54.

Operation of the memory device 88 is similar to that of the memory device 86 and will now be described with reference to FIG. 6. A memory cell $C_{k,l,i,j,2m}$, which is located at the $2m^{th}$ level and at the $i^{th}$ and $j^{th}$ positions along the y and x-directions, respectively, within the memory block $B_{k,l}$ that is located in the $k^{th}$ and $l^{th}$ segments of the memory device 86 in the y and x-directions, respectively, may be chosen for a read or write operation by selecting one of the first wiring lines denoted by $MX_{k,i}$ (not shown), one of the second wiring lines denoted by $MY_{l,j}$ (not shown), one of the first gate lines 62 denoted by $GY_{1,l,2m}$, one of the second gate lines 68 denoted by $GY_{2,l,2m}$, one of the third gate lines 72 denoted by $GX_{1,k,m}$, and one of the fourth gate lines 82 denoted by $GX_{2,k,m}$. An voltage $V_x$ may be applied to the first wiring line $MX_{k,i}$ and/or another voltage $V_y$ may be applied to the second wiring line $MY_{l,j}$. After the relevant gate lines are selected, the voltage $V_x$ from the first wiring line $MX_{k,i}$ may be transmitted to one of the first local wiring lines 54 denoted by $SX_{k,l,i,2m}$ through both ends thereof via two of the first contacts 64, one of the first line select transistors 58 denoted by $TX_{1,k,l,i,2m}$, and one of the second line select transistors 60 denoted by $TX_{2,k,l,i,2m}$. Similarly, the voltage $V_y$ from the second wiring line $MY_{l,j}$ may be transmitted to one of the second local wiring lines 56 denoted by $SY_{k,l,j,m}$ through both ends thereof via two of the second contacts 74, one of the third line select transistors 70 denoted by $TY_{1,k,l,j,m}$, and one of the fourth line select transistors 84 denoted by $TY_{2,k,l,j,m}$. As the voltage difference between the first and second local wiring lines $SX_{k,l,i,2m}$ and $SY_{k,l,j,m}$ across the memory cell $C_{k,l,i,j,2m}$ exceeds a threshold, the selection element of the memory cell $C_{k,l,i,j,2m}$ becomes sufficiently conductive, thereby selecting the memory element of the memory cell $C_{k,l,i,j,2m}$ for read or write operation.

Figure 7A:
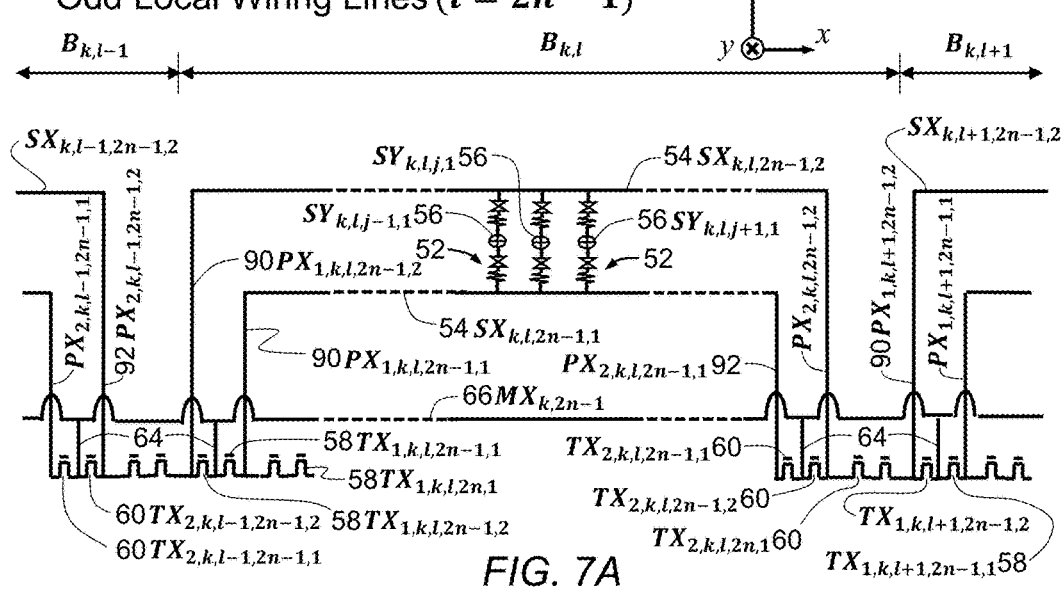
FIGS. 7A and 7B are schematic circuit diagrams illustrating arrangements of wiring lines in stitch regions of the memory devices of FIGS. 5 and 6.
Figure 7B:
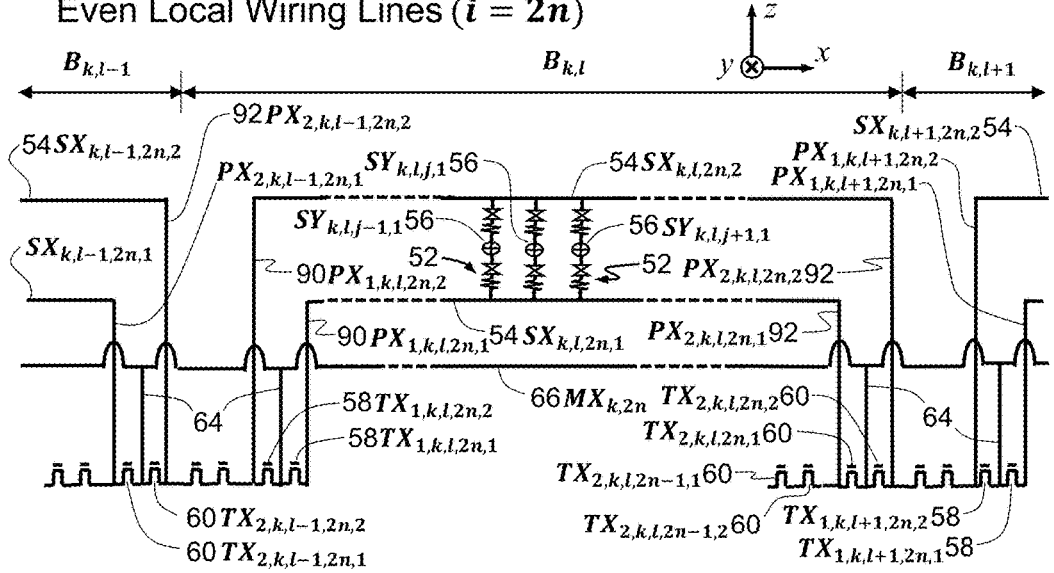

The connections between the first local wiring lines 54 and the first wiring lines 66 for the multi-layered memory devices 86 and 88 are illustrated in FIGS. 7A and 7B. In the drawing, reference numerals 52-60, 64, and 66 denote the same or similar components as those shown for the memory devices 86 and 88 in FIGS. 5 and 6, respectively. For reasons of clarity and brevity, only the first two layers of memory cells 52 and components electrically connected thereto are shown in FIGS. 7A and 7B. However, the connection scheme to be described herein may be applied to a memory device with one or more than two layers of memory cells.

Unlike the exemplary memory device 50 shown in FIG. 3, whose first wiring lines 66 are formed at one level above the first local wiring lines 54 and spaced apart at a pitch comparable to the center-to-center distance between two adjacent memory cells 52, the memory devices 86 and 88 may use a different connection scheme in which the first wiring lines 66 are divided into two levels below the first local wiring lines 54. Because there are half as many lines at each level, the first wiring lines 66 at each of the two levels may be spaced apart at a pitch that is about twice the center-to-center distance between two adjacent memory cells 52. For example, the first wiring lines 66 that are connected to odd first local wiring lines (i.e. $SX_{k,l,2n-1,m}$ with $n \geq 1$) may occupy the lower level while those that are connected to even first local wiring lines (i.e. $SX_{k,l,2n,m}$ with $n \geq 1$) may occupy the upper level.

FIG. 7A is a sectional view that shows one of the first wiring lines 66 denoted by $MX_{k,2n-1}$ at the lower level connecting to the odd first local wiring lines 54 at the first and second memory layers denoted by $SX_{k,l,2n-1,1}$ and $SX_{k,l,2n-1,2}$, respectively, in the memory block $B_{k,l}$, where n is an integer greater than or equal to 1. One end of the first local wiring line $SX_{k,l,2n-1,1}$ at the first memory layer is connected to a terminal (source or drain) of the first line select transistor $TX_{1,k,l,2n-1,1}$ formed therebeneath through one of a plurality of first local contacts 90 denoted by $PX_{1,k,l,2n-1,1}$, while the other end is connected to a terminal (source or drain) of the second line select transistor $TX_{2,k,l,2n-1,1}$ formed therebeneath through one of a plurality of second local contacts 92 denoted by $PX_{2,k,l,2n-1,1}$. The other terminal (source or drain) of the first line select transistor $TX_{1,k,l,2n-1,1}$ and the other terminal (source or drain) of the second line select transistor $TX_{2,k,l,2n-1,1}$ are electrically connected to the first wiring line $MX_{k,2n-1}$ above through two first contacts 64, respectively. Similarly, one end of the first local wiring line $SX_{k,l,2n-1,2}$ at the second memory level is connected to a terminal (source or drain) of the first line select transistor $TX_{1,k,l,2n-1,2}$ formed therebeneath through the first local contact $PX_{1,k,l,2n-1,2}$, while the other end is connected to a terminal (source or drain) of the second line select transistor $TX_{2,k,l,2n-1,2}$ formed therebeneath through the second local contact $PX_{2,k,l,2n-1,2}$. The other terminal (source or drain) of the first line select transistor $TX_{1,k,l,2n-1,2}$ and the other terminal (source or drain) of the second line select transistor $TX_{2,k,l,2n-1,2}$ are electrically connected to the first wiring line $MX_{k,2n-1}$ above through two first contacts 64, respectively. To minimize the number of the first contacts 64, two adjacent line select transistors may share a contact as shown. For example, the first line select transistors $TX_{1,k,l,2n-1,1}$ and $TX_{1,k,l,2n-1,2}$ may share one of the first contacts 64, while the second line select transistors $TX_{2,k,l,2n-1,1}$ and $TX_{2,k,l,2n-1,2}$ may share another one of the first contacts 64.

Likewise, FIG. 7B is a sectional view that shows one of the first wiring lines 66 denoted by $MX_{k,2n}$ at the upper level connecting to the even first local wiring lines at the first and second memory layers denoted by $SX_{k,l,2n,1}$ and $SX_{k,l,2n,2}$, respectively, in the memory block $B_{k,l}$, where n is an integer greater than or equal to 1. One end of the first local wiring line $SX_{k,l,2n,1}$ at the first memory layer is connected to a terminal (source or drain) of the first line select transistor $TX_{1,k,l,2n,1}$ formed therebeneath through the first local contact $PX_{1,k,l,2n,1}$, while the other end is connected to a terminal (source or drain) of the second line select transistor $TX_{2,k,l,2n,1}$ formed therebeneath through the second local contact $PX_{2,k,l,2n,1}$. The other terminal (source or drain) of the first line select transistor $TX_{1,k,l,2n,1}$ and the other terminal (source or drain) of the second line select transistor $TX_{2,k,l,2n,1}$ are electrically connected to the first wiring line $MX_{k,2n}$ above through two first contacts 64, respectively. Similarly, one end of the first local wiring line $SX_{k,l,2n,2}$ at the second memory level is connected to a terminal (source or drain) of the first line select transistor $TX_{1,k,l,2n,2}$ formed therebeneath through the first local contact $PX_{1,k,l,2n,2}$, while the other end is connected to a terminal (source or drain) of the second line select transistor $TX_{2,k,l,2n,2}$ formed therebeneath through the second local contact $PX_{2,k,l,2n,2}$. The other terminal (source or drain) of the first line select transistor $TX_{1,k,l,2n,2}$ and the other terminal (source or drain) of the second line select transistor $TX_{2,k,l,2n,2}$ are electrically connected to the first wiring line $MX_{k,2n}$ above through two first contacts 64, respectively.

While FIGS. 7A and 7B show the odd and even first local wiring lines connecting to the first wiring lines at the lower and upper levels, respectively, the odd and even first local wiring lines may alternatively connect to the first wiring lines at the upper and lower levels, respectively. Moreover, additional memory layers and first local wiring lines connected thereto may be added by inserting additional local contacts and line selection transistors adjacent to the current contacts and transistors along the x-direction, as illustrated in FIGS. 8A and 8B.

Figure 8A:
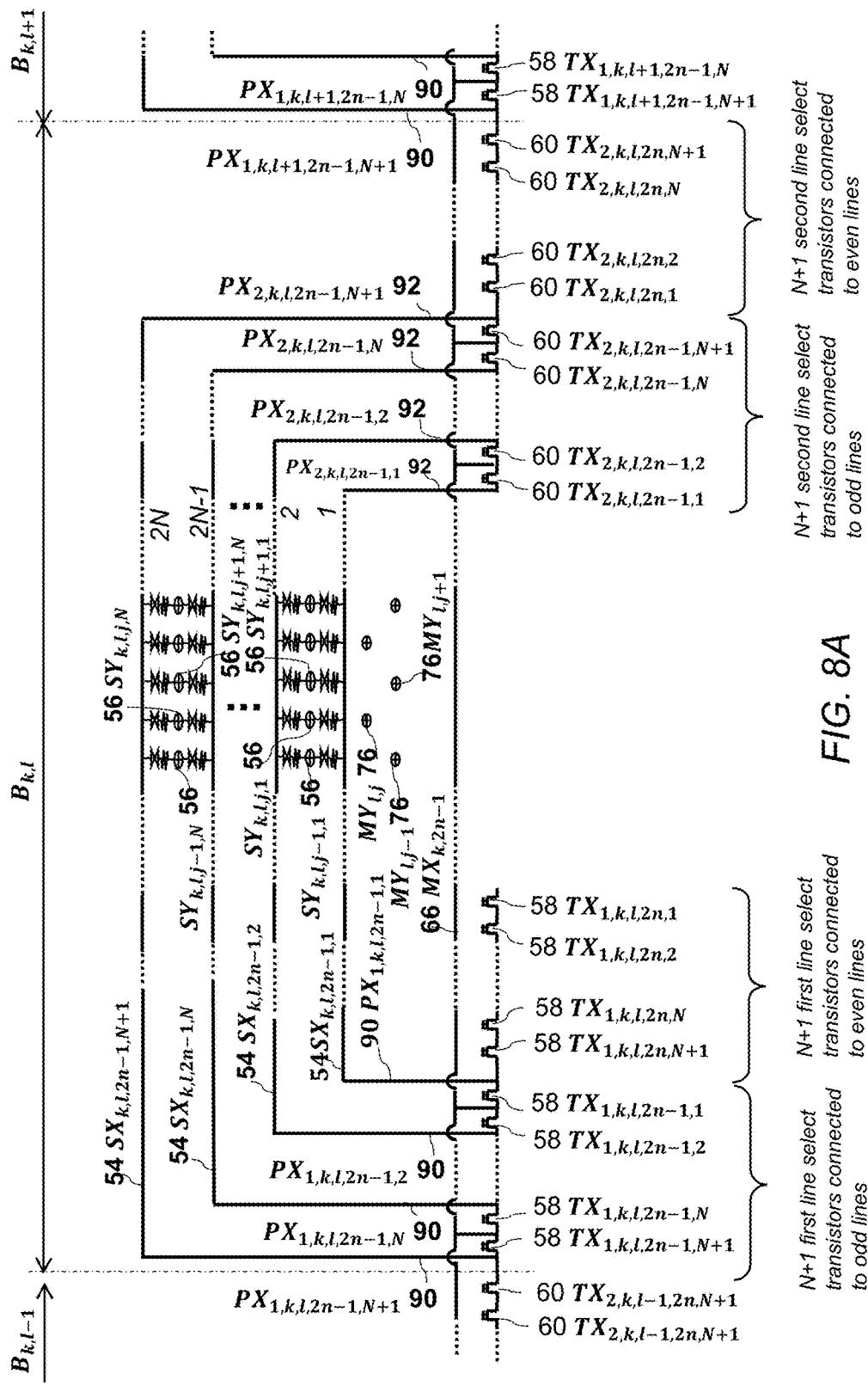
FIGS. 8A and 8B are schematic circuit diagrams illustrating arrangements of wiring lines in stitch regions of the memory device of FIG. 5.
Figure 8B:
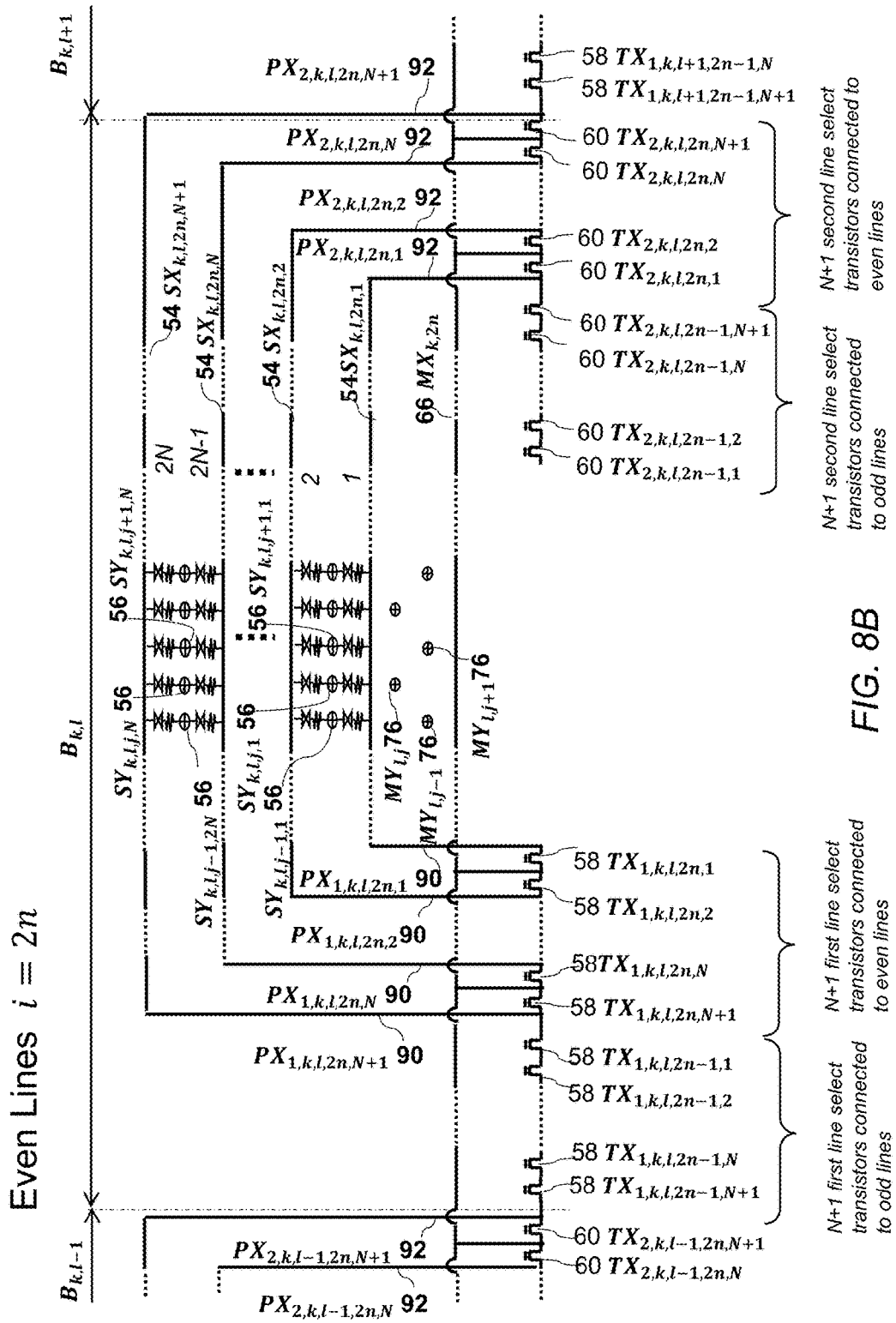

FIG. 8A is a sectional view that shows one of the first wiring lines 66 denoted by $MX_{k,2n-1}$ at the lower level connecting to N+1 number of odd first local wiring lines 54 at the 2N levels of memory layers denoted by $SX_{k,l,2n-1,1}$, $SX_{k,l,2n-1,2}$ ... $SX_{k,l,2n-1,N}$, $SX_{k,l,2n-1,N+1}$, respectively, in the memory block $B_{k,l}$ of the memory device 86. At one end of the memory block $B_{k,l}$, N+1 number of first line selection transistors 58 ($TX_{1,k,l,2n-1,1}$, $TX_{1,k,l,2n-1,2}$ ... $TX_{1,k,l,2n-1,N+1}$) and the first local contacts 90 ($PX_{1,k,l,2n-1,1}$, $PX_{1,k,l,2n-1,2}$ ... $PX_{1,k,l,2n-1,N+1}$) connected to the odd first local wiring lines of all layers are grouped together. At the other end of the memory block $B_{k,l}$, N+1 number of second line selection transistors 60 ($TX_{2,k,l,2n-1,1}$, $TX_{2,k,l,2n-1,2}$ ... $TX_{2,k,l,2n-1,N+1}$) and the second local contacts 92 ($PX_{2,k,l,2n-1,1}$, $PX_{2,k,l,2n-1,2}$ ... $PX_{2,k,l,2n-1,N+1}$) connected to the odd first local wiring lines are grouped together. Similarly, FIG. 8B is a sectional view that shows one of the first wiring lines 66 denoted by $MX_{k,2n}$ at the upper level connecting to N+1 number of even first local wiring lines 54 at the 2N levels of memory layers denoted by $SX_{k,l,2n,1}$, $SX_{k,l,2n,2}$ ... $SX_{k,l,2n,N}$, $SX_{k,l,2n,N+1}$, respectively. At one end of the memory block $B_{k,l}$, N+1 number of first line selection transistors 58 ($TX_{1,k,l,2n,1}$, $TX_{1,k,l,2n,2}$ ... $TX_{1,k,l,2n,N+1}$) and the first local contacts 90 ($PX_{1,k,l,2n,1}$, $PX_{1,k,l,2n,2}$ ... $PX_{1,k,l,2n,N+1}$) connected to the even first local wiring lines of all layers are grouped together. At the other end of the memory block $B_{k,l}$, N+1 number of second line selection transistors 60 ($TX_{2,k,l,2n,1}$, $TX_{2,k,l,2n,2}$ ... $TX_{2,k,l,2n,N+1}$) and the second local contacts 92 ($PX_{2,k,l,2n,1}$, $PX_{2,k,l,2n,2}$ ... $PX_{2,k,l,2n,N+1}$) connected to the even first local wiring lines are grouped together. The line selection transistors and the local contacts corresponding to different layers of the first local wiring lines are grouped according to their types (first or second) and the parity (odd or even) of the first local wiring lines connected thereto.

Referring back to FIGS. 7A and 7B, the first wiring lines $MX_{k,2n-1}$ and $MX_{k,2n}$ at the lower and upper levels, respectively, extend along the x-direction and couple to the first contacts 64 in multiple memory blocks (i.e. $B_{k,l-1}$, $Bk_{k,l}$, $Bk_{k,l+1}$, and so forth) while circumventing the first and second local contacts 90 and 92 along the way. The circumvention is possible because of the increased spacing between adjacent first wiring lines 66 at each level and the local contacts 90 and 92 connected to odd and even first local wiring lines 54 being arranged to stagger along the x-direction. For example, in the boundary or stitch region between the memory blocks $B_{k,l-1}$ and $B_{k,l}$, the pair even local contacts $PX_{2,k,l-1,2n,1}/PX_{2,k,l-1,2n,2}$ connected to even lines are disposed in between the pairs of odd local contacts $PX_{2,k,l-1,2n-1,1}/PX_{2,k,l-1,2n-1,2}$ and $PX_{1,k,l,2n-1,2}/PX_{2,k,l,2n-1,1}$, which are connected to odd lines, in the x-direction.

Figure 9A:
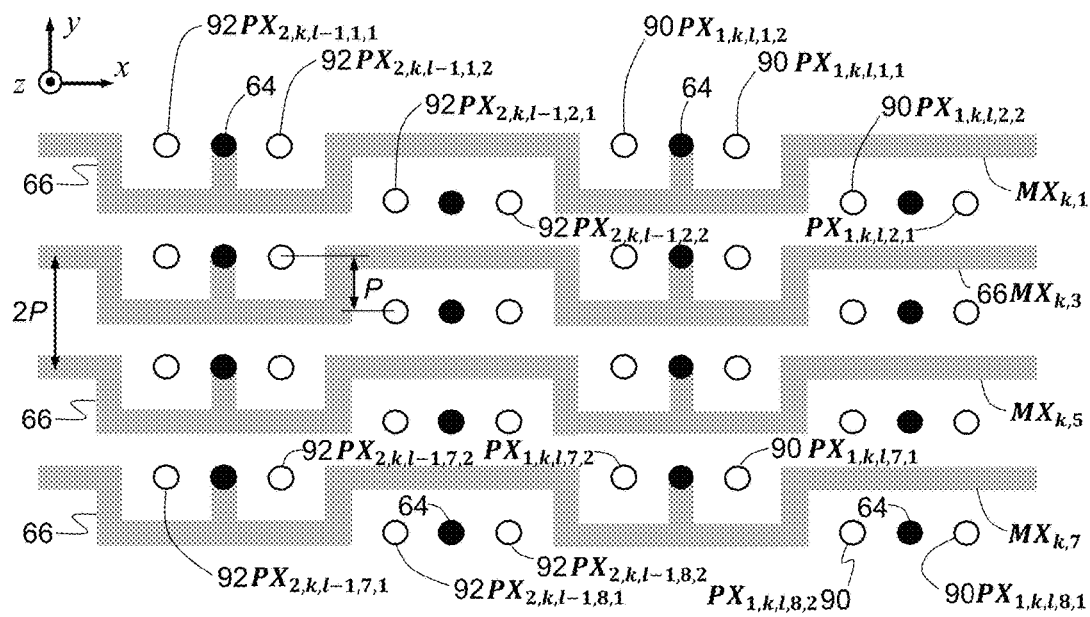
FIGS. 9A and 9B are planar views of stitch regions illustrating arrangements of contacts and wiring lines in accordance with an embodiment of the present invention.
Figure 9B:
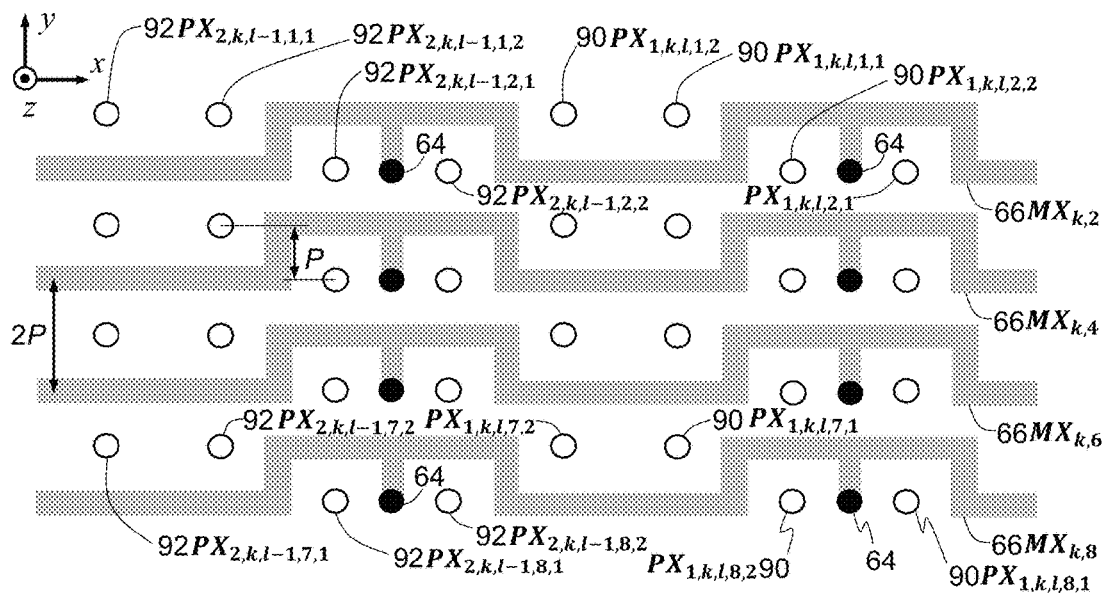

The arrangement of the first wiring lines 66 around the local contacts 90 and 92 may be further illustrated by FIGS. 9A and 9B, which are planar views of the first wiring lines 66 at the lower and upper levels, respectively, in the boundary or stitch region between the memory blocks $B_{k,l-1}$ and $B_{k,l}$. The plurality of the first wiring lines 66 at the lower level, which are connected to the odd first local wiring lines $SX_{k,l-1,2n-1,m}$ and $SX_{k,l,2n-1,m}$, are represented by $MX_{k,2n-1}$ (n=1-4) in FIG. 9A, while the plurality of the first wiring lines 66 at the upper level, which are connected to the even first local wiring lines $SX_{k,l-1,2n,m}$ and $SX_{k,l,2n,m}$, are represented by $MX_{k,2n}$ (n=1-4) in FIG. 9B. The memory cells 52, the first local wiring lines 54, and the local contacts 90 and 92, which align with the respective memory cells 52 and the respective first local wiring lines 54 along the same lines in the x-direction, are arranged to have a same pitch of P in the y-direction. By contrast, the first wiring lines 66 at the lower level $MX_{k,1}$, $MX_{k,3}$, $MX_{k,5}$, $MX_{k,7}$, and so forth, have a pitch of 2P along the y-direction in the memory region, as illustrated in FIG. 9A, because the first wiring lines 66 are evenly split into two levels, thereby halving the line density at each level. Moreover, the first contacts 64 and the local contacts 90 and 92 are arranged in a stagger pattern with those connected to the even first local wiring lines $SX_{k,l,2n,m}$ shifted a distance in the x-direction with respect to those connected to the odd first local wiring lines $SX_{k,l,2n-1,m}$. For example, the pair of even local contacts $PX_{2,k,l-1,2,1}/PX_{2,k,l-1,2,2}$, which are connected to the even local lines $SX_{k,l-1,2,1}$ and $SX_{k,l-1,2,2}$, respectively, are disposed in between the pairs of odd local contacts $PX_{2,k,l-1,1,1}/PX_{2,k,l-1,1,2}$ and $PX_{1,k,l,1,2}/PX_{1,k,l,1,1}$, which are connected to odd local lines, in the x-direction, and are spaced apart from the same pairs of local contacts a distance of P in the y-direction. The increased separation between the first wiring lines 66 at the lower level and the stagger arrangement of the local contacts 90 and 92 enable each of the first wiring lines ($MX_{k,1}$, $MX_{k,3}$, $MX_{k,5}$, $MX_{k,7}$, and so forth) at the lower level to zigzag or meander through the array of the local contacts 90 and 92 in the stitch region while making connections to the respective first contacts 64. Likewise, FIG. 9B shows that the increased separation between the first wiring lines 66 at the upper level and the stagger arrangement of the local contacts 90 and 92 enable each of the first wiring lines ($MX_{k,2}$, $MX_{k,4}$, $MX_{k,6}$, $MX_{k,8}$, and so forth) at the upper level to zigzag or meander through the array of the local contacts 90 and 92 in the stitch region while making connections to the respective first contacts 64.

With continuing reference to FIGS. 9A and 9B, the first wiring lines 66 have an increased pitch of 2P along the y-direction in the memory regions, where the memory cells 52 reside in between the stitch regions. Because of the increased pitch, the width of the first wiring lines 66 as measured along the y-direction may be markedly increased up to a width that is equivalent to $2P-D_{min}$, where $D_{min}$ is the minimum clearance between two adjacent first wiring lines 66. In embodiments where the pitch P corresponds to 2F, the width of the first wiring lines 66 in the memory regions may be increased to at least 3F, which is about three times that of the word lines or bit lines in conventional memory devices. Assuming the aspect ratio of the cross section of the first wiring lines 66 is maintained, the increase in width would translate to an increased cross section area that is 9 times the cross section of conventional word or bit lines, thereby significantly reducing the parasitic resistance.

Figure 10:
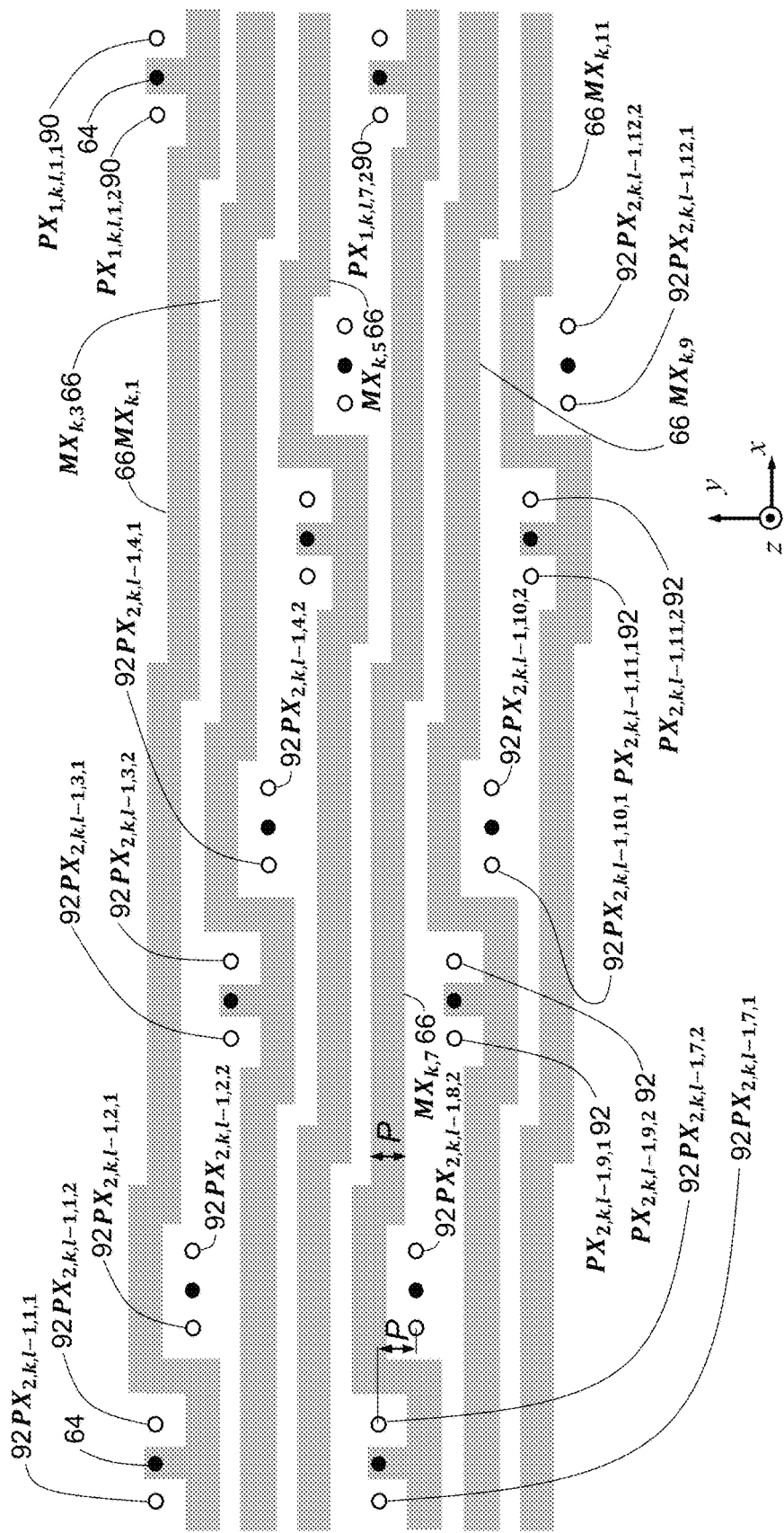
FIG. 10 is a planar view of a stitch region illustrating an exemplary arrangement of contacts and wiring lines in accordance with another embodiment of the present invention.

The width of the first wiring lines 66 in the stitch regions may also be increased by rearranging the first contacts 64 and the first and second local contacts 90 and 92 to increase the separation distances therebetween in accordance with another embodiment illustrated in FIG. 10, which is a planar view showing the arrangement of the contacts 64, 90, and 92 and the first wiring lines 66 at the lower level ($MX_{k,1}$, $MX_{k,3}$, $MX_{k,5}$, $MX_{k,7}$, $MX_{k,9}$, $MX_{k,11}$, and so forth) connected to the odd local wiring lines $SX_{k,l-1,2n-1,m}$ in the stitch region between the memory blocks $B_{k,l-1}$ and $B_{k,l}$. Compared with the contact arrangement illustrated in FIG. 9A, where only the even local contacts (i.e. $PX_{1,k,l-1,2n,m}$, $PX_{2,k,l-1,2n,m}$, $PX_{1,k,l,2n,m}$, $PX_{2,k,l,2n,m}$, and so forth) are shifted with respect to the odd local contacts, the contact arrangement of FIG. 9 further shifts some of the odd local contacts to create even more room for the passage of the first wiring lines 66. For example, the contact pairs of $PX_{2,k,l-1,9,1}/PX_{2,k,l-1,9,2}$ and $PX_{2,k,l-1,10,1}/PX_{2,k,l-1,10,2}$ are shifted in the x-direction with respect to the contact pairs of $PX_{2,k,l-1,7,1}/PX_{2,k,l-1,7,2}$ and $PX_{2,k,l-1,8,1}/PX_{2,k,l-1,8,2}$, and the contact pairs of $PX_{2,k,l-1,11,1}/PX_{2,k,l-1,11,2}$ and $PX_{2,k,l-1,12,1}/PX_{2,k,l-1,12,2}$ are further shifted in the x-direction with respect to the contact pairs of $PX_{2,k,l-1,9,1}/PX_{2,k,l-1,9,2}$ and $PX_{2,k,l-1,10,1}/PX_{2,k,l-1,10,2}$ in a cascading manner. The contact arrangement of FIG. 10 allows the width of the meandering first wiring lines 66 at the lower level in the stitch region to increase to at least P, which is about twice the width of F for conventional word or bit lines. As would be recognized by one skilled in the art, the first wiring lines 66 at the upper level in the stitch region (not shown) can be similarly arranged to increase the width thereof to at least P like those in the lower level.

In addition to the exemplary contact patterns illustrated in FIGS. 9A, 9B, and 10, numerous other patterns may also be utilized. For example, the contacts in FIG. 10 may be further separated such that subsequent contact pairs $PX_{2,k,l-1,13,1}/PX_{2,k,l-1,13,2}$ and $PX_{2,k,l-1,14,1}/PX_{2,k,l-1,14,2}$, $PX_{2,k,l-1,15,1}/PX_{2,k,l-1,15,2}$ and $PX_{2,k,l-1,16,1}/PX_{2,k,l-1,16,2}$, and so forth, may continue in the same cascading manner, thereby allowing the first wiring lines 66 to further widen up to a dimension of $2P-D_{min}$.

The connections between the second local wiring lines 56 and the second wiring lines 76 for the multi-layered memory devices 86 and 88 are analogous to the connections between the first local wiring lines 54 and the first wiring lines 66 as described above and illustrated in FIGS. 7A/B-9A/B and 10. The second wiring lines 76 may be divided into two levels disposed beneath the second local wiring lines 56. The second wiring lines 76 may be disposed beneath or above the first wiring lines 66. Like the first wiring lines 66, the increased separation between the second wiring lines 76 at each of the two levels and the stagger or cascading arrangement of the local contacts enable the second wiring lines 76 to zigzag or meander through the array of the local contacts in the stitch regions while making connections to the respective second contacts 74.

The previously described embodiments of the present invention have many advantages, including lower voltage drop for the local wiring lines and lower parasitic resistance for the wiring lines. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. For example, the contacts in the stitch region may be arranged differently to attain similar results. Thus the scope of the invention should be determined by the appended claims and their legal equivalents, rather than by examples given.

What is claimed is:

1. A memory device comprising:
a first layer of memory cells, each cell of said first layer of memory cells including a two-terminal selection element coupled to a memory element in series;
a plurality of first local wiring lines connected to one ends of said first layer of memory cells along a first direction, each of said first local wiring lines being electrically connected to two first line selection transistors at two ends thereof; and
a plurality of second local wiring lines connected to other ends of said first layer of memory cells along a second direction substantially orthogonal to said first direction, each of said second local wiring lines being electrically connected to two second line selection transistors at two ends thereof.

2. The memory device of claim 1 further comprising:
a plurality of first wiring lines extending along said first direction; and
a plurality of second wiring lines extending along said second direction,
wherein said two first line selection transistors at two ends of each of said first local wiring lines are further connected to one of said first wiring lines, said two second line selection transistors at two ends of each of said second local wiring lines are further connected to one of said second wiring lines.

3. The memory device of claim 2, wherein said first wiring lines are disposed beneath said first local wiring lines and said second wiring lines are disposed beneath said second local wiring lines.

4. The memory device of claim 2, wherein said first and second wiring lines each are split into two levels.

5. The memory device of claim 4, wherein said first and second wiring lines are substantially wider than said first and second local wiring lines.

6. The memory device of claim 4, wherein said first layer of memory cells are periodically arranged to have a pitch of P along said first and second directions, a width of said first and second wiring lines is greater than or equal to about P and less than about 2P.

7. The memory device of claim 1, wherein said two-terminal selection element is an Ovanic threshold switch.

8. The memory device of claim 1, wherein said two-terminal selection element is a diode.

9. The memory device of claim 1, wherein said memory element comprises a phase change chalcogenide compound.

10. The memory device of claim 1, wherein said memory element comprises a precipitate bridging metal oxide.

11. The memory device of claim 1, wherein said memory element comprises two magnetic layers with an insulating tunnel junction layer interposed therebetween.

12. The memory device of claim 1 further comprising:
a second layer of memory cells with one ends thereof coupled to said second local wiring lines, each cell of said second layer of memory cells including said two-terminal selection element coupled to said memory element in series; and
a plurality of third local wiring lines connected to other ends of said second layer of memory cells along said first direction, each of said third local wiring lines being electrically connected to two third line selection transistors at two ends thereof.

13. The memory device of claim 12 further comprising:
at least one more layer of memory cells with each cell including said two-terminal selection element coupled to said memory element in series; and
at least one more layer of a plurality of local wiring lines.

14. The memory device of claim 12, wherein said two-terminal selection element is an Ovanic threshold switch.

15. The memory device of claim 12, wherein said two-terminal selection element is disposed adjacent to a respective one of said second local wiring lines.

16. The memory device of claim 12, wherein said memory element comprises two magnetic layers with an insulating tunnel junction layer interposed therebetween.

17. The memory device of claim 12 further comprising:
a plurality of first wiring lines extending along said first direction; and
a plurality of second wiring lines extending along said second direction,
wherein said two first line selection transistors at two ends of each of said first local wiring lines are further connected to one of said first wiring lines, said two second line selection transistors at two ends of each of said second local wiring lines are further connected to one of said second wiring lines, said two third line selection transistors at two ends of each of said third local wiring lines are further connected to one of said first wiring lines.

18. The memory device of claim 17, wherein said first wiring lines are disposed beneath said first local wiring lines and said second wiring lines are disposed beneath said second local wiring lines.

19. The memory device of claim 17, wherein said first and second wiring lines each are split into two levels.

20. The memory device of claim 17, wherein said first and second wiring lines are substantially wider than said first, second, and third local wiring lines.

21. The memory device of claim 17, wherein said first and second layers of memory cells are periodically arranged to have a pitch of P along said first and second directions, a width of said first and second wiring lines is greater than or equal to about P and less than about 2P.

* * * * *